United States Patent
Bennett et al.

(10) Patent No.: US 8,255,087 B2
(45) Date of Patent: Aug. 28, 2012

(54) CONSTANT AIR VOLUME HVAC SYSTEM WITH A DEHUMIDIFICATION FUNCTION AND DISCHARGE AIR TEMPERATURE CONTROL, AN HVAC CONTROLLER THEREFOR AND A METHOD OF OPERATION THEREOF

(75) Inventors: Alan E. Bennett, Denton, TX (US); Mark D. Hess, Plano, TX (US); Stephen A. Walter, Flower Mound, TX (US)

(73) Assignee: Lennox Industries Inc., Richardson, TX (US)

( * ) Notice: Subject to any disclaimer, the term of this patent is extended or adjusted under 35 U.S.C. 154(b) by 278 days.

(21) Appl. No.: 12/694,473

(22) Filed: Jan. 27, 2010

(65) Prior Publication Data

US 2010/0298987 A1 Nov. 25, 2010

Related U.S. Application Data

(60) Provisional application No. 61/180,405, filed on May 21, 2009.

(51) Int. Cl.
G05D 23/00 (2006.01)

(52) U.S. Cl. .................................. 700/278; 700/276

(58) Field of Classification Search .................. 700/276, 700/278

See application file for complete search history.

(56) References Cited

U.S. PATENT DOCUMENTS

| | | | | |
|---|---|---|---|---|
| 5,461,877 A * | 10/1995 | Shaw et al. | | 62/185 |
| 6,070,110 A * | 5/2000 | Shah et al. | | 700/278 |
| 6,170,271 B1 * | 1/2001 | Sullivan | | 62/93 |
| 6,269,650 B1 * | 8/2001 | Shaw | | 62/176.6 |
| 7,062,930 B2 * | 6/2006 | Rayburn | | 62/173 |
| 7,266,960 B2 * | 9/2007 | Shah | | 62/176.6 |
| 7,726,140 B2 * | 6/2010 | Rayburn et al. | | 62/175 |
| 7,987,023 B2 * | 7/2011 | Bush et al. | | 700/277 |
| 2005/0023362 A1 * | 2/2005 | Wacker | | 236/44 R |
| 2008/0315000 A1 * | 12/2008 | Gorthala et al. | | 236/46 C |
| 2009/0064697 A1 * | 3/2009 | Kondo et al. | | 62/271 |
| 2009/0277193 A1 * | 11/2009 | Springer et al. | | 62/93 |
| 2010/0204838 A1 * | 8/2010 | DiPaolo et al. | | 700/278 |
| 2010/0298989 A1 * | 11/2010 | Hess et al. | | 700/276 |

* cited by examiner

Primary Examiner — Ryan Jarrett

(57) ABSTRACT

An HVAC controller, a method of operating a constant air volume (CAV) HVAC unit and a CAV HVAC system are disclosed herein. In one embodiment, the HVAC controller includes: (1) an interface configured to receive both a latent cooling demand and a sensible cooling demand and (2) a processor configured to direct both a dehumidification function and a discharge air temperature control function for a CAV HVAC system employing the latent cooling demand and the sensible cooling demand.

16 Claims, 2 Drawing Sheets

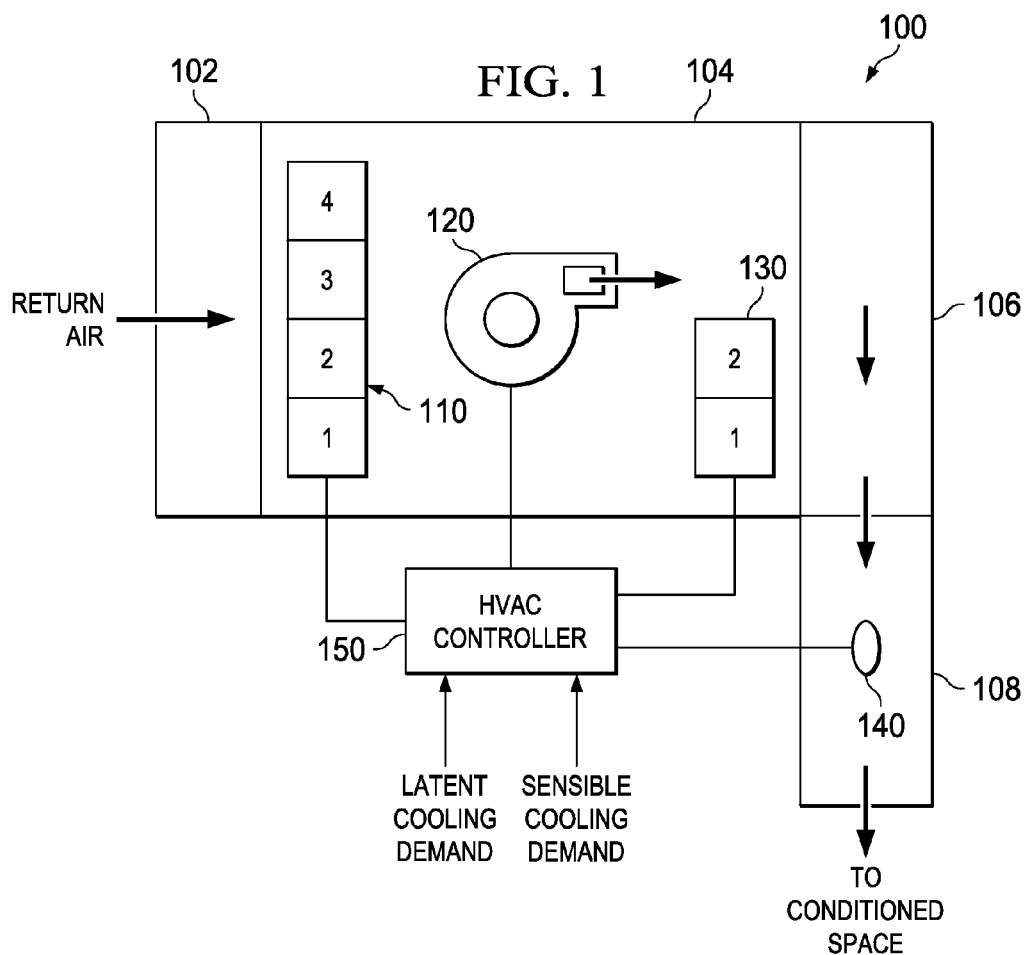
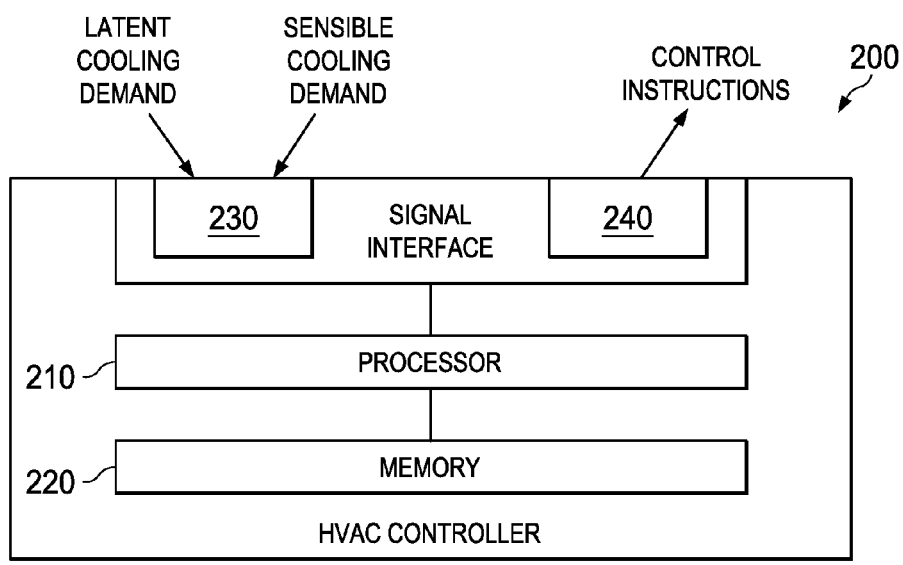

CONSTANT AIR VOLUME HVAC SYSTEM WITH A DEHUMIDIFICATION FUNCTION AND DISCHARGE AIR TEMPERATURE CONTROL, AN HVAC CONTROLLER THEREFOR AND A METHOD OF OPERATION THEREOF

CROSS-REFERENCE TO RELATED APPLICATION

This application claims the benefit of U.S. Provisional Application Ser. No. 61/180,405 filed by Mark Beste, et al. on May 21, 2009, entitled "Comprehensive HVAC Control System," commonly assigned with this application and incorporated herein by reference.

TECHNICAL FIELD

This application is directed, in general, to heating, ventilating and air conditioning (HVAC) systems and, more specifically, to a dehumidification function and a discharge air temperature control function for HVAC systems.

BACKGROUND

HVAC systems can be used to regulate the environment within an enclosure. Typically, an air blower is used to pull air from the enclosure into the HVAC system through ducts and push the air back into the enclosure through additional ducts after conditioning the air (e.g., heating, cooling or dehumidifying the air). Various types of HVAC systems, such as roof top units, may be used to provide conditioned air for enclosures. Additionally, different techniques may be employed for controlling the capacity of the HVAC systems. Two such techniques are variable air volume (VAV) and constant air volume (CAV).

In a VAV system, the temperature of the supply air for the enclosure is substantially constant and the air flow rate is varied to meet the thermal changes in the enclosure. A control function based on discharge air temperature may be used to control operation of a VAV HVAC system. As such, a sensor may be employed to determine the discharge air temperature of the HVAC system. Employing a discharge air temperature control allows an HVAC unit to typically deliver around 55° F. discharge supply air temperature.

In a CAV system, the air flow rate of the supply air is substantially constant and the temperature of the supply air is varied to meet thermal changes. In a CAV HVAC system, humidity may be more of a problem than with a VAV HVAC system. Thus, CAV HVAC systems may include a dehumidification function, such as employing reheat coils. Humiditrol® from Lennox Industries, Incorporated of Richardson, Tex., is an example of such a dehumidification function. Humiditrol® or other hot-gas reheat systems may reheat conditioned air to about 70° F. or more to provide discharged air that has a lower relative humidity, but not temperature, than the enclosure. This can be a result of the enclosure requiring more latent than sensible cooling.

SUMMARY

One aspect an HVAC controller. In one embodiment, the HVAC controller includes: (1) an interface configured to receive both a latent cooling demand and a sensible cooling demand and (2) a processor configured to direct both a dehumidification function and a discharge air temperature control function for a constant air volume (CAV) HVAC system employing the latent cooling demand and the sensible cooling demand.

In another aspect, a method of operating a CAV HVAC unit having compressor and evaporator coils and employing both a discharge air temperature control function and a dehumidification function. In one embodiment, the method includes: (1) receiving at least one of a latent cooling demand or a sensible cooling demand, (2) determining if both a latent cooling demand and a sensible cooling demand are being simultaneously processed and (3) activating the compressor and evaporator coils of the HVAC unit having corresponding reheat coils in response to the latent cooling demand if the latent cooling demand has been received and the sensible cooling demand has not been received.

In yet another aspect, a CAV HVAC system is provided. In one embodiment, the CAV HVAC system includes: (1) compressor and evaporator coils, (2) reheat coils corresponding to at least one of the compressor and evaporator coils, (3) an air blower configured to move air across the compressor and evaporator coils and the reheat coils and (4) a controller configured to direct operation of the compressor and evaporator coils, the reheat coils and the air blower, the controller having (4A) an interface configured to receive both a latent cooling demand and a sensible cooling demand for the CAV HVAC system and (4B) a processor configured to direct both a dehumidification function and a discharge air temperature control function for the CAV HVAC system employing the latent cooling demand and the sensible cooling demand.

BRIEF DESCRIPTION

Reference is now made to the following descriptions taken in conjunction with the accompanying drawings, in which:

FIG. 1 is a block diagram of an embodiment of an HVAC system constructed according to the principles of the disclosure;

FIG. 2 is a diagram of an embodiment of a HVAC controller constructed according to the principles of the disclosure.

DETAILED DESCRIPTION

Figure 3:
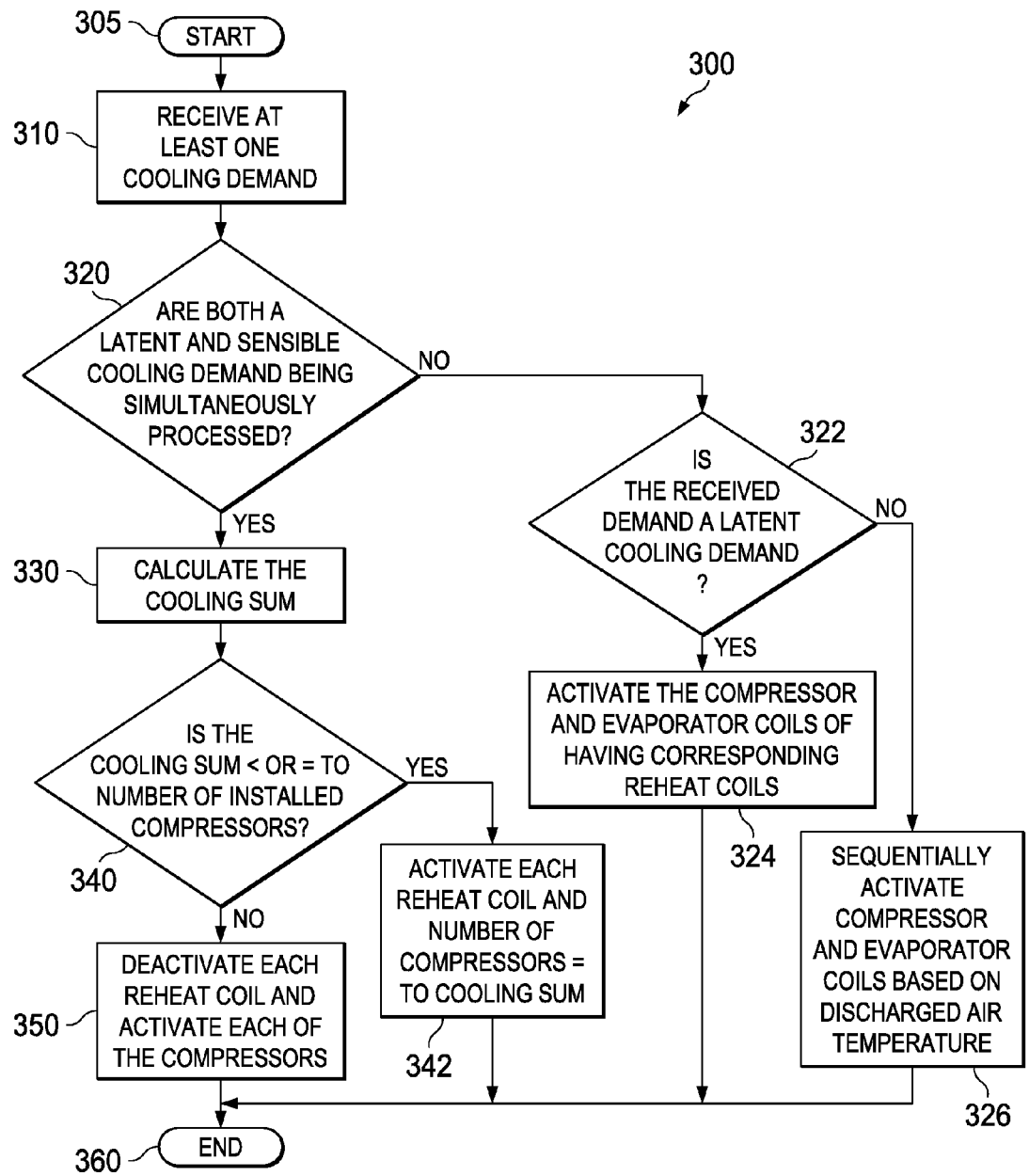
FIG. 3 is a flow diagram of an embodiment of a method of operating a CAV HVAC system carried out according to the principles of the disclosure.

In addition to a dehumidification function, applications may also call for a CAV HVAC system to employ a discharge air temperature control function. Operating a CAV HVAC system employing both a dehumidification function and a discharge air temperature control function can be difficult. The disclosure provides an embodiment of a CAV HVAC system that monitors unit discharge temperature to optimally operate compressors for conditioning air and reheat coils for dehumidification. The HVAC system balances the need for both sensible and latent cooling demands to improve the effect of the available cooling capacity. As such, CAV HVAC embodiments are disclosed that provide both dehumidification control using reheat coils and discharge air temperature control using a discharge air temperature sensor. An HVAC controller is also disclosed that manages the operation of both the dehumidification control and the discharge air temperature control to allow these two functions to operate together. The dehumidification control with reheat coils may be Humiditrol® by Honeywell.

FIG. 1 is a block diagram of an embodiment of an HVAC system 100 constructed according to the principles of the disclosure. The HVAC system 100 includes a return duct 102, a return plenum 104, a supply duct 106 and a supply plenum 108. Additionally, the HVAC system 100 includes a compressor and evaporator coils 110, an air blower 120, reheat coils 130, a discharge air temperature sensor 140 and a HVAC controller 150. The compressor and evaporator coils 110 include a first, second, third and fourth unit that is denoted by the numbers 1-4 in FIG. 1. Each compressor and evaporator coil combination may represent a cooling stage of the HVAC system 100. The reheat coils 130 include a first unit and a second unit that are denoted by the numbers 1 and 2 in FIG. 1. The first and second units of the reheat coils 130 correspond to the first and second units of the compressor and evaporator coils 110.

One skilled in the art will understand that the HVAC system 100 may include additional components and devices that are not presently illustrated or discussed but are typically included in an HVAC system, such as, a power supply, exhaustion fans, etc. A thermostat (not shown) is also typically employed with the HVAC system 100 and used as a user interface.

The HVAC system 100 is a constant air volume (CAV) unit wherein the supply air flow rate is constant or substantially constant and the supply air temperature is varied to meet cooling demands. The various illustrated components of the HVAC system 100 may be contained within a single enclosure (e.g., a cabinet). In one embodiment, the HVAC system 100 is a rooftop unit.

The compressor and evaporator coils 110, the air blower 120, the reheat coils 130 and the discharge air temperature sensor 140 may be conventional devices that are typically employed in HVAC systems. The HVAC controller 150 causes the air blower 120 to move air across the evaporator coils, the reheat coils 130, the discharge air temperature sensor 140 and into a conditioned space. At least some of the operation of the HVAC system 100 can be controlled by the HVAC controller 150 based on inputs from various sensors of the HVAC system 100 including the discharge air temperature sensor 140.

The HVAC controller 150 may include a processor, such as a microprocessor, configured to direct the operation of the HVAC system 100. Additionally, the HVAC controller 150 may include a memory section including instructions that direct the operation of the processor. The memory section may be a conventional memory. The memory section may include a series of operating instructions that direct the operation of the HVAC controller 150 (e.g., the processor) when initiated thereby. The series of operating instructions may represent algorithms that are used to coordinate the operation of a dehumidification function and a discharge air temperature control function at the same time when processing both a sensible cooling demand and a latent cooling demand.

The HVAC controller 150 receives and responds to cooling demands for the HVAC system 100. As illustrated, the cooling demands may be a latent cooling demand or a sensible cooling demand. A latent cooling demand is used for dehumidification. A latent cooling demand may be the result of high humidity in the conditioned space or even in outside air being used by the HVAC system 100. In response to a latent cooling demand, the HVAC controller 150 may respond by activating all of the compressor and evaporator coils 110 that have corresponding reheat coils installed therewith. Thus, in the HVAC system 100, the HVAC controller 150 may energize the first and second units of the compressor and evaporator coils 110 and the first and second units of the reheat coils 130. Accordingly, the air that has been cooled by moving across the first and second units of the compressor and evaporator coils 110 is reheated by moving across the first and second units of the reheat coils 130. The cooled air is reheated to an approximately neutral temperature by the reheat coils and returned to the conditioned space with reduced humidity but at approximately the same dry-bulb temperature as when the air left the conditioned space.

A sensible cooling demand may be the result of a high dry-bulb temperature in the conditioned space or even a high dry-bulb temperature of outside air being used by the HVAC system 100. In response, the HVAC controller 150 responds by activating the compressor evaporator coils 110 in sequence (e.g., first through fourth) until the discharge temperature value determined by the discharge air temperature sensor 140 reaches a setpoint value. When the discharge temperature value falls below the setpoint value, the compressor and evaporator coils are deactivated in sequence (e.g., fourth through first) to maintain the discharge temperature value within a permitted range of the setpoint value.

In addition to having both a dehumidification function and a discharge air temperature control function, the HVAC system 100 may also process both of these functions at the same time. In the HVAC system 100, the HVAC controller 150 is configured to control the operation of the HVAC system 100 when latent and sensible cooling demands are processed at the same time.

When both latent and sensible cooling demands are present at the same time, the HVAC controller 150 calculates a cooling sum by adding all of the cooling stages installed with a reheat coil to the number of cooling stages required for sensible cooling to maintain the discharge temperature value that corresponds to the sensible cooling demand. If the value of the cooling sum is less than or equal to the number of compressors installed in the HVAC system 100, then the value of the cooling sum is the number of compressors that are activated. Additionally, all of the reheat coils are activated.

For example, for the HVAC system 100, if a sensible cooling demand requires one cooling stage, the HVAC controller 150 would add one and two (the number of cooling stages with corresponding reheat coils) to obtain a cooling sum of three. Since three is less than four which is the number of compressors that the HVAC system 100 includes, then three of the compressor and evaporator coils 110 are activated and all of the reheat coils 130 are activated.

If the value of the cooling sum is greater than the number of compressors installed in the HVAC system, then all of the installed compressors are activated. Additionally, the reheat coils 130 are turned-off until the number of compressors running without reheat is equal to the number required for the sensible cooling demand. In some embodiments, the reheat coils 130 may be kept off.

For example, if a sensible cooling demand requires three cooling stages, the HVAC controller 150 would add three and two (the number of cooling stages with corresponding reheat coils) to obtain a cooling sum of five. Since five is greater than four which is the number of compressors that the HVAC system 100 includes, then all four of the installed compressor and evaporator coils 110 are activated. The reheat coils 130 remain deactivated until the number of compressors running without reheat is equal to three.

As illustrated in FIG. 1, the HVAC controller 150 is coupled to the various components of the HVAC system 100. In some embodiments, the connections therebetween are through a wired-connection. A conventional cable and contacts may be used to couple the HVAC controller 150 to the various components of the HVAC system 100. In other embodiments, a wireless connection may also be employed to provide at least some of the connections.

FIG. 2 is a block diagram of an embodiment of an HVAC controller 200 constructed according to the principles of the disclosure. The HVAC controller 200 is configured to control operations of an HVAC system. The HVAC controller 200 includes a processor 210 and a memory section 220. Additionally, the HVAC controller 200 includes additional components such as a signal interface having an input port 230 and an output port 240. The HVAC controller 200 may also include other components typically included within a controller for a HVAC system, such as a power supply or power port. The processor 210 is configured to direct both a dehumidification function and a discharge air temperature control function for a CAV HVAC system employing a latent cooling demand and a sensible cooling demand. Latent and sensible cooling demands may be received at the input port 230 of the signal interface. Control instructions may then be transmitted via the output port 240 of the signal interface.

The memory 220 may be a conventional memory. The memory 220 may include a series of operating instructions that direct the operation of the processor 210 when initiated thereby. The series of operating instructions may represent algorithms that are used to control the dehumidification function and the discharge air temperature control function. The algorithm may be represented by the flow diagram illustrated in FIG. 3.

FIG. 3 is a flow diagram of an embodiment of a method 300 of operating a CAV HVAC unit carried out according to the principles of the disclosure. The CAV HVAC unit includes compressor and evaporator coils and employs both a discharge air temperature control function and a dehumidification function. An HVAC controller such as described with respect to FIG. 1 or FIG. 2 may be used to perform the method 300. The method 300 may represent an algorithm that is stored on a computer readable medium, such as a memory of an HVAC controller (e.g., the memory 220 of FIG. 2) as a series of operating instructions. The method 300 begins in a step 305.

In a step 310 at least one type of cooling demand is received. The cooling demand or demands are received at a controller for the HVAC unit via an interface. The interface may be an input port. The cooling demand may be a latent cooling demand or a sensible cooling demand. Both cooling demands may be received at approximately the same time.

A determination is then made in a first decisional step 320 if both a latent cooling demand and a sensible cooling demand are being simultaneously processed. A latent cooling demand and a sensible cooling demand may be simultaneously processed if received by the controller within a designated period of time. The designated period of time may be due to the operating characteristics of the HVAC controller or associated circuitry. In some embodiments, the designated period of time may be selected by a manufacturer of the HVAC controller or HVAC system. The designated period of time may be programmed into the HVAC controller.

If both of the cooling demands are not being simultaneously processed, the method 300 continues to a second decisional step 322 where a determination is made if received cooling demand is a latent cooling demand. If a latent cooling demand has been received, the method 300 continues to a step 324 where the compressor and evaporator coils of the HVAC unit having corresponding reheat coils are activated. The method 300 continues until a step 360 and ends.

Returning now to the second decisional step 322, if the received cooling demand is not a latent cooling demand, then the method 300 continues to a step 326. If the received cooling demand is not a latent cooling demand, then the received cooling demand is a sensible cooling demand. As such, at step 326, the compressor and evaporator coils of the HVAC system are sequentially activated based on a discharged air temperature of the HVAC system. The method 300 continues until the step 360.

Returning to first decisional step 320, if both a latent cooling demand and a sensible cooling demand are being simultaneously processed, a cooling sum is calculated in a step 330. The cooling sum may be determined by adding a number of cooling stages of the HVAC system having a corresponding reheat coil with a number of cooling stages required to maintain a discharge air temperature of the HVAC system.

In a third decisional step 340, a determination is made if the cooling sum is less than or equal to a number of compressors installed in the HVAC system. If the cooling sum is less than or equal to the number of compressors installed in the HVAC system, each reheat coil of the HVAC system is activated and the number of compressors of the HVAC system equivalent to a value of the cooling sum are activated in a step 342. The method 300 continues until the step 360.

Returning now to the third decisional step 330, each reheat coil of the HVAC system is deactivated and each of the compressors are activated when determining the cooling sum is greater than the number of compressors in a step 340. The deactivation of the reheat coils is maintained until a number of compressors activated without reheat is equal to a number of compressors required for the sensible cooling demand. The method 300 ends at the step 360.

The above-described methods may be embodied in or performed by various conventional digital data processors, microprocessors or computing devices, wherein these devices are programmed or store executable programs of sequences of software instructions to perform one or more of the steps of the methods, e.g., steps of the method of FIG. 3. The software instructions of such programs may be encoded in machine-executable form on conventional digital data storage media, e.g., magnetic or optical disks, random-access memory (RAM), magnetic hard disks, flash memories, and/or read-only memory (ROM), to enable various types of digital data processors or computing devices to perform one, multiple or all of the steps of one or more of the above-described methods, e.g., one or more of the steps of the method of FIG. 3. Additionally, an apparatus, such as dedicated HVAC controller, may be designed to include the necessary circuitry to perform each step of the methods of FIG. 3.

Those skilled in the art to which this application relates will appreciate that other and further additions, deletions, substitutions and modifications may be made to the described embodiments.

What is claimed is:

1. A heating, ventilating and air conditioning (HVAC) controller, comprising:
   an interface configured to receive both a latent cooling demand and a sensible cooling demand; and
   a processor configured to simultaneously process said latent cooling demand and said sensible cooling demand and direct both a dehumidification function and a discharge air temperature control function for a constant air volume (CAV) HVAC system employing said latent cooling demand and said sensible cooling demand, said processor configured to calculate a cooling sum by summing a number of cooling stages of said CAV HVAC system having a corresponding reheat coil with a number of cooling stages required to maintain a discharge air temperature of said CAV HVAC system.

2. The HVAC controller as recited in claim 1 wherein said processor if further configured to determine if said cooling sum is less than or equal to a number of compressors installed in said CAV HVAC system.

3. The HVAC controller as recited in claim 2 wherein said processor is configured to activate each reheat coil of said CAV HVAC system and activate a number of compressors of said CAV HVAC system equivalent to a value of said cooling sum when determining said cooling sum is less than or equal to a number of compressors installed in said CAV HVAC system.

4. The HVAC controller as recited in claim 2 wherein said processor is configured to have each reheat coil of said CAV HVAC system deactivated and each of said compressors activated when determining said cooling sum is greater than said number of compressors.

5. The HVAC controller as recited in claim 4 wherein said processor is further configured to keep said reheat coils deactivated until a number of compressors activated without reheat is equal to a number of compressors required for said sensible cooling demand.

6. A method of operating a constant air volume (CAV) heating, ventilating and air conditioning (HVAC) unit having compressor and evaporator coils and employing both a discharge air temperature control function and a dehumidification function, said method comprising:
   receiving at least one of a latent cooling demand or a sensible cooling demand;
   determining if both a latent cooling demand and a sensible cooling demand are being simultaneously processed;
   directing both a dehumidification function and a discharge air temperature control function for said CAV HVAC system when simultaneously processing both said latent cooling demand and said sensible cooling demand, wherein said directing includes calculating a cooling sum by summing a number of cooling stages of said CAV HVAC system having a corresponding reheat coil with a number of cooling stages required to maintain a discharge air temperature of said CAV HVAC system; and
   activating said compressor and evaporator coils of said HVAC unit having corresponding reheat coils in response to said latent cooling demand if said latent cooling demand has been received and said sensible cooling demand has not been received.

7. The method as recited in claim 6 further comprising sequentially activating said compressor and evaporator coils based on a discharge air temperature of said CAV HVAC system if said latent cooling demand has not been received and said sensible cooling demand has been received.

8. The method as recited in claim 6 further comprising determining if said cooling sum is less than or equal to a number of compressors installed in said CAV HVAC system.

9. The method as recited in claim 8 further comprising activating each reheat coil of said CAV HVAC system and activate a number of compressors of said CAV HVAC system equivalent to a value of said cooling sum when determining said cooling sum is less than or equal to a number of compressors installed in said CAV HVAC system.

10. The method as recited in claim 8 further comprising deactivating each reheat coil of said CAV HVAC system and activating each of said compressors when determining said cooling sum is greater than said number of compressors.

11. The method as recited in claim 10 further comprising maintaining deactivation of said reheat coils until a number of compressors activated without reheat is equal to a number of compressors required for said sensible cooling demand.

12. A constant air volume (CAV) heating, ventilating and air conditioning (HVAC) system, comprising:
   compressor and evaporator coils;
   reheat coils corresponding to at least one of said compressor and evaporator coils;
   an air blower configured to move air across said compressor and evaporator coils and said reheat coils; and
   a controller configured to direct operation of said compressor and evaporator coils, said reheat coils and said air blower, comprising:
      an interface configured to receive both a latent cooling demand and a sensible cooling demand for said CAV HVAC system; and
      a processor configured to simultaneously process said latent cooling demand and said sensible cooling demand and direct both a dehumidification function and a discharge air temperature control function for said CAV HVAC system employing said latent cooling demand and said sensible cooling demand, wherein said processor is configured to calculate a cooling sum by adding a number of cooling stages of said CAV HVAC system having a corresponding reheat coil with a number of cooling stages required to maintain a discharge air temperature of said CAV HVAC system.

13. The CAV HVAC system as recited in claim 12 wherein said processor if further configured to determine if said cooling sum is less than or equal to a number of compressors installed in said CAV HVAC system.

14. The CAV HVAC system as recited in claim 13 wherein said processor is configured to activate each reheat coil of said CAV HVAC system and activate a number of compressors of said CAV HVAC system equivalent to a value of said cooling sum when determining said cooling sum is less than or equal to a number of compressors installed in said CAV HVAC system.

15. The CAV HVAC system as recited in claim 13 wherein said processor is configured to have each reheat coil of said CAV HVAC system deactivated and each of said compressors activated when determining said cooling sum is greater than said number of compressors.

16. The CAV HVAC system as recited in claim 15 wherein said processor is further configured to keep said reheat coils deactivated until a number of compressors activated without reheat is equal to a number of compressors required for said sensible cooling demand.

* * * * *